(12) United States Patent
Danek et al.

(10) Patent No.: US 8,617,982 B2
(45) Date of Patent: Dec. 31, 2013

(54) SUBTRACTIVE PATTERNING TO DEFINE CIRCUIT COMPONENTS

(75) Inventors: Michal Danek, Cupertino, CA (US);
 Juwen Gao, San Jose, CA (US); Ronald A. Powell, Portola Valley, CA (US);
 Aaron R. Fellis, Sunnyvale, CA (US)

(73) Assignee: Novellus Systems, Inc., Fremont, CA (US)

( * ) Notice: Subject to any disclaimer, the term of this patent is extended or adjusted under 35 U.S.C. 154(b) by 220 days.

(21) Appl. No.: 13/251,446

(22) Filed: Oct. 3, 2011

(65) Prior Publication Data

US 2012/0080793 A1 Apr. 5, 2012

Related U.S. Application Data

(60) Provisional application No. 61/390,125, filed on Oct. 5, 2010.

(51) Int. Cl.
 *H01L 21/4763* (2006.01)
(52) U.S. Cl.
 USPC ........... 438/629; 438/622; 438/627; 438/637; 257/E23.011; 257/774
(58) Field of Classification Search
 USPC ........... 257/E21.584, E21.158, E23.011, 751, 257/774; 438/618, 622, 627, 629, 660, 661, 438/678, 687, 637, FOR. 355
 See application file for complete search history.

(56) References Cited

U.S. PATENT DOCUMENTS

| | | | |
|---|---|---|---|
| 6,323,120 B1 * | 11/2001 | Fujikawa et al. | 438/629 |
| 6,340,633 B1 * | 1/2002 | Lopatin et al. | 438/625 |
| 6,451,682 B1 * | 9/2002 | Fujikawa et al. | 438/618 |
| 6,838,375 B2 | 1/2005 | Hu | 438/649 |
| 6,858,534 B2 * | 2/2005 | Mouli | 438/659 |
| 6,943,105 B2 * | 9/2005 | Joshi | 438/622 |
| 7,244,677 B2 * | 7/2007 | Ritzdorf et al. | 438/687 |
| 7,259,061 B2 * | 8/2007 | Kundalgurki | 438/244 |
| 7,429,532 B2 * | 9/2008 | Ramaswamy et al. | 438/689 |
| 7,432,192 B2 * | 10/2008 | Feng et al. | 438/627 |
| 7,589,017 B2 | 9/2009 | Chan et al. | 438/648 |
| 7,732,922 B2 * | 6/2010 | Yang et al. | 257/751 |
| 7,741,226 B2 * | 6/2010 | Andry et al. | 438/701 |
| 7,843,063 B2 * | 11/2010 | Baker-O'Neal et al. | 257/751 |
| 7,994,558 B2 | 8/2011 | Lim et al. | 257/301 |
| 8,022,548 B2 * | 9/2011 | Oladeji et al. | 257/758 |
| 8,053,365 B2 | 11/2011 | Humayun et al. | 438/675 |
| 2002/0037644 A1 | 3/2002 | Rha et al. | 438/656 |
| 2002/0096768 A1 | 7/2002 | Joshi | 257/750 |

FOREIGN PATENT DOCUMENTS

KR 10-1999-0016355 3/1999

OTHER PUBLICATIONS

U.S. Appl. No. 12/535,464, filed Aug. 4, 2009, entitled "Depositing Tungsten Into High Aspect Ratio Features".
U.S. Appl. No. 12/833,823, filed Jul. 9, 2010, entitled "Depositing Tungsten Into High Aspect Ratio Features".

(Continued)

*Primary Examiner* — Chris Chu
(74) *Attorney, Agent, or Firm* — Weaver Austin Villeneuve & Sampson LLP (57) ABSTRACT

Certain embodiments pertain to local interconnects formed by subtractive patterning of blanket layer of tungsten or other conductive material. The grain sizes of tungsten or other deposited metal can be grown to relatively large dimensions, which results in increased electrical conductivity due to, e.g., reduced electron scattering at grain boundaries as electrons travel from one grain to the next during conduction.

17 Claims, 9 Drawing Sheets

(56) References Cited

OTHER PUBLICATIONS

U.S. Appl. No. 12/332,017, filed Dec. 10, 2008, entitled "Method for Depositing Tungsten Film Having Low Resistivity, Low Roughness and High Reflectivity".

U.S. Appl. No. 12/535,377, filed Aug. 4, 2009, entitled "Methods for Depositing Tungsten Films Having Low Resistivity for Gapfill Applications".

U.S. Appl. No. 12/755,259, filed Apr. 6, 2010, entitled Methods for Depositing Ultra Thin Low Resistivity Tungsten Film for Small Critical Dimension Contacts and Interconnects.

International Search Report and Written Opinion, dated Apr. 19, 2012, issued in PCT/US2011/054798.

* cited by examiner

SUBTRACTIVE PATTERNING TO DEFINE CIRCUIT COMPONENTS

BACKGROUND

During the decade beginning in 2000, the copper damascene process became the dominant IC fabrication technology employed to form metal interconnects. In the damascene process, a dielectric layer is patterned to provide recessed features defining the locations of interconnect lines and/or vias. These features are then conformally coated with a thin layer of diffusion barrier material such as tantalum nitride. Subsequently conductive copper is electroplated into the patterned features to form conductive lines and vias.

SUMMARY

Certain embodiments described herein pertain to the design and fabrication of local tungsten interconnects. These embodiments are particularly useful in small dimension features such as those encountered in advanced logic applications. In specific embodiments, a via or interconnect is formed by subtractive patterning of blanket layer of tungsten, particularly low-resistivity tungsten. In comparison to conventional copper damascene interconnect fabrication schemes, the described embodiments provide (i) lower via resistance and (ii) superior reliability (e.g., electromigration resistance), both enabling high performance interconnects in device nodes beyond 22 nm. As explained more fully below, the blanket deposition followed by subtractive patterning has the advantage of producing lower resistivity metals in the via. Briefly, this is because the grain sizes of the deposited metal can be grown to a larger dimension in the blanket film deposition than in conformal fill deposition. Larger grain sizes in a material produce increased electrical conductivity due to reduced electron scattering at grain boundaries as electrons travel from one grain to the next during conduction.

Certain aspects pertain to methods of preparing vias or lines for a semiconductor device. The following discussion will make reference to "vias" but it applies equally to interconnect lines and other conductive current carrying features of a device. The methods may be characterized by the following operations: (a) forming a blanket layer of metal over a partially fabricated semiconductor device; (b) providing a pattern of vias on the blanket layer; and (c) removing regions of the blanket layer to produce the vias defined by the pattern. The vias have grains of the metal, which grains have a size (e.g., an average or mean size) greater than one-half the width of the smallest via in the pattern. Typically, the blanket layer formed in (a) has a thickness that is at least about the height of the vias to be prepared. In various embodiments the metal is tungsten or a tungsten alloy. In some cases, the metal is copper or a copper alloy.

Forming the blanket layer of metal may be accomplished by, e.g., a physical vapor deposition or ionized physical vapor deposition of the metal. In a specific embodiment, a tungsten or copper alloy is physically vapor deposited to form the metal layer. In one implementation, removing the regions of the blanket layer includes the following operations: (i) anisotropically etching the blanket layer to produce oversized vias; and (ii) trimming the oversized vias.

In some embodiments, a method additionally includes the following operations: (d) filling the region between the vias with a dielectric material; (e) forming a blanket layer of metal (e.g., tungsten) over the vias; and (f) patterning the blanket layer to form interconnect lines. Operations, (a)-(f) produce a complete metallization layer, one having both vias and interconnect lines. Of course, the process may be repeated to form one or more additional metallization layers.

In certain embodiments, when tungsten is used in the vias, it has a resistivity of at most about 30 µΩ cm (and in some cases at most about 15 µΩ cm). The grain size of the metal in the vias (or lines) may be at least about 5 nm, or at least about 10 nm or at least about 25 nm. In some implementations, the semiconductor device has dimensions specified by a technology node at or beyond the 22 nanometer technology node.

Certain aspects pertain to integrated circuits which may be characterized by the following features: (a) a plurality of electronic devices fabricated on a semiconductor substrate; and (b) one or more metallization layers electronically connecting the plurality of electronic devices. At least one of the metallization layers contains multiple vias, each having a via height and including a conductive metal comprising one or more metal grains of size substantially greater than one-half the via width (e.g., substantially as great as the via height). In some embodiments, the conductive metal in at least one of the vias contains a single metal grain that occupies the entire via. In various embodiments, at least some of the vias have widths of not greater than about 25 nanometers. Further, in some implementations, the integrated circuit has dimensions specified by a technology node at or beyond the 22 nanometer technology node.

In certain embodiments, the conductive metal is tungsten or a tungsten alloy. Further, the tungsten in the vias may have a resistivity of at most about 30 µΩ cm, or in some cases at most about 15 µΩ cm. The integrated circuit may additionally include a barrier layer lining each of the plurality of vias.

These and other features and advantages will be described below with reference to the associated drawings.

DETAILED DESCRIPTION

Conventional tantalum nitride and copper damascene interconnect fabrication processing may not be suitable for technology nodes beyond 22 nanometers (e.g., the 15 or 16 nanometer node). Among the major difficulties are reliability (primarily damage from electromigration) and high via resistance. The former is related to the increase in current density, partially due to a corresponding decrease in line width. The latter is related to the minimum copper diffusion barrier thickness that is required for reliable performance of devices (line leakage, ILD leakage, electromigration, and stress migration). This recognition led the inventors to explore alternate metallization schemes.

Low resistivity tungsten might be considered as a replacement for conventional tantalum nitride—copper fill. However, the resistivity of tungsten in narrow vias and trenches has been understood in the art to be too high. This is partly because the bulk resistivity of tungsten is strongly dependent on the tungsten film thickness/grain size, with tungsten films that have larger grain sizes also having higher conductivity. See the graph of FIG. 1A. In this graph, tungsten resistivity is presented on the y-axis as a function of the tungsten effective thickness. In this figure, the "effective tungsten thickness" corresponds to the average grain size or dimension in the direction of current flow.

Figure 1A:
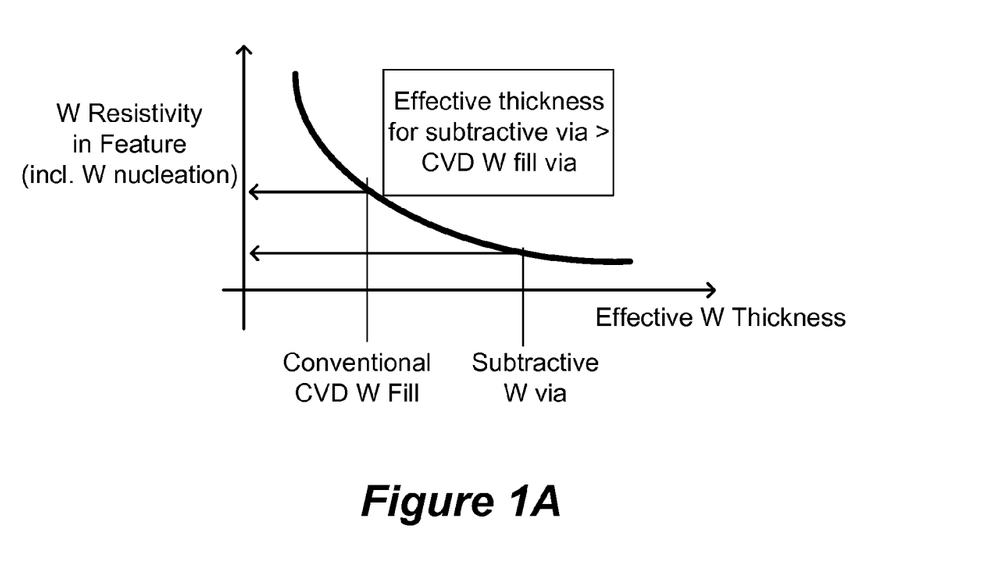
FIG. 1A is graph depicting, in general terms, the decrease in tungsten resistivity with increasing effective thickness.
Figure 1B:
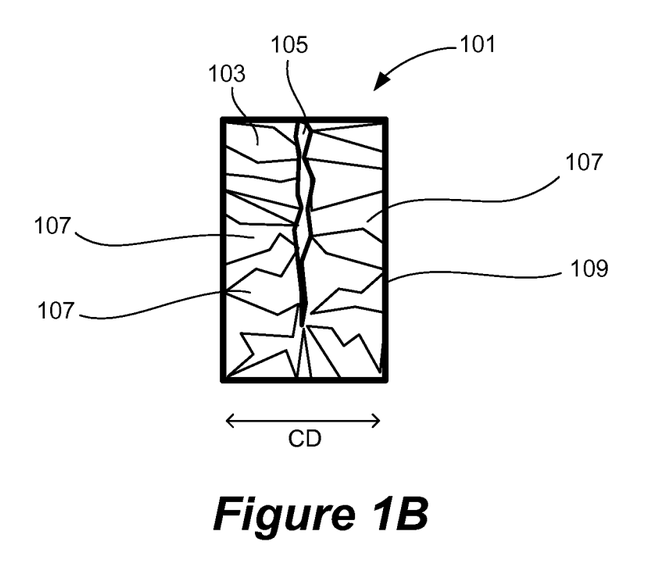
FIG. 1B is a cartoon depiction of tungsten grains grown in a via or line template.

Unfortunately, current technology limits the grain size to approximately one-half the critical dimension due to the conformal nature of the CVD tungsten deposition. More specifically, the grain size is limited to the thickness of the film deposited into the feature, which thickness is $0.5 \times (CD - 2T_{liner})$, where CD is the critical dimension of the feature and $T_{liner}$ is the thickness of liner (Ti/TiN). This can be understood with reference to FIG. 1B, which shows chemical vapor deposited tungsten in a via or trench. In conventional via filling technology, tungsten is deposited by CVD and not PVD because PVD is insufficiently conformal and forms voids in the via fill. However, CVD deposited tungsten conformally follows the contours of the via and therefore limits the tungsten grain size as depicted in FIG. 1B. Thus, tungsten's conductivity in vias is correspondingly limited. It has been observed that tungsten via resistance attained by CVD deposition is approximately 20% higher than copper via resistance attained by electrofilling in vias having 30 nanometer diameters.

Certain disclosed embodiments such as those depicted in FIGS. 2A-F pertain to methods of forming conductive vias by first depositing a blanket layer of tungsten and then performing subtractive patterning on the layer to define vias containing the deposited tungsten. Subsequently the via layer is completed by filling gaps around the metal vias with an insulating material. In a specific embodiment, tungsten is deposited by a chemical vapor deposition or physical vapor deposition process. As explained below, other deposition processes are also acceptable and even desirable for some applications.

The tungsten in the resulting vias has substantially the same morphology as that of the deposited blanket layer. Grains of tungsten as deposited remain substantially intact in the resulting vias. This means that the height of the grains is, on average, a significant fraction of the via height. Often, the grain size is substantially the same as the via height. As a consequence, the tungsten in the vias has a conductivity significantly higher than that of conformally deposited tungsten and, in fact, comparable to that of electrodeposited copper.

In some embodiments, the average tungsten grain size in the blanket film is significantly greater than the lateral size of the vias or interconnect lines. In this case, subtractive patterning results in the vias on average being filled with part of a single tungsten grain—effectively producing single crystal tungsten fill. However, this is not necessary to realize the benefits of subtractive patterning. In some embodiments, the tungsten grain size is relatively small in comparison to the via or line dimensions.

Not surprisingly, the blanket deposition and subtractive patterning process finds particular application in back end of line (BEOL) processing for advanced technology node fabrication processes such as the 22 nanometer node and beyond.

In a specific example, the tungsten subtractive patterning process is employed in metallization layers M1-M3 for logic applications at 22 nanometer node or more advanced technology nodes. However, the process is not limited to any particular technology node or application.

While the disclosed embodiments can be practiced using conformal deposition methods such as CVD, ALD, iALD, etc, other methods with lower step coverage (e.g., PVD) can also be used because the initial tungsten is deposited as a two-dimensional blanket film. It has not been feasible previously to utilize PVD for tungsten fill given its relatively poor step coverage; however, in the case of subtractive patterning processes, the tungsten can be deposited using PVD or ionized PVD (iPVD) from a tungsten sputter target.

In various embodiments, the tungsten target employed in a PVD process may be either planar or three-dimensional (e.g., a hollow cathode magnetron (HCM) target employed in some tools available from Novellus Systems, Inc. of San Jose, Calif.). Various combinations of PVD/CVD are within the scope of the disclosed embodiments. For example, a pulsed nucleation layer (PNL) tungsten nucleation layer may be deposited as described below, followed by deposition of a low resistance tungsten layer and then a PVD tungsten layer. Low resistance tungsten is typically deposited by a CVD process.

Additionally, PVD allows deposition of tungsten alloys such as W—Al which have lower resistance than pure tungsten but cannot be readily deposited using CVD methods. It should also be noted that other metals may be used in place of tungsten in various embodiments disclosed herein. All metal conductors exhibit grain boundary scattering and other so-called "size effects" that increase their resistivity. Therefore the disclosed subtractive patterning processes may be employed to produce vias and/or interconnect lines for metals such as copper, aluminum, titanium, tantalum, ruthenium, cobalt, etc as well as corresponding compounds (e.g. TiW and TaN) and alloys (e.g. W(Al), Cu(Al), W(Cu), W(Re), Cu(Ti), Cu(Mn), and Cu(Mg)). As with tungsten, these other metals, compounds, and alloys may be patterned in a subtractive manner for use in advanced node fabrication processes. With regard to Cu and its alloys, it can be problematic to perform subtractive patterning with plasma etching given the low volatility of Cu halides. However, other methods such as reactive or inert ion beam milling can be used as alternatives to plasma etching Cu.

Figure 2A:
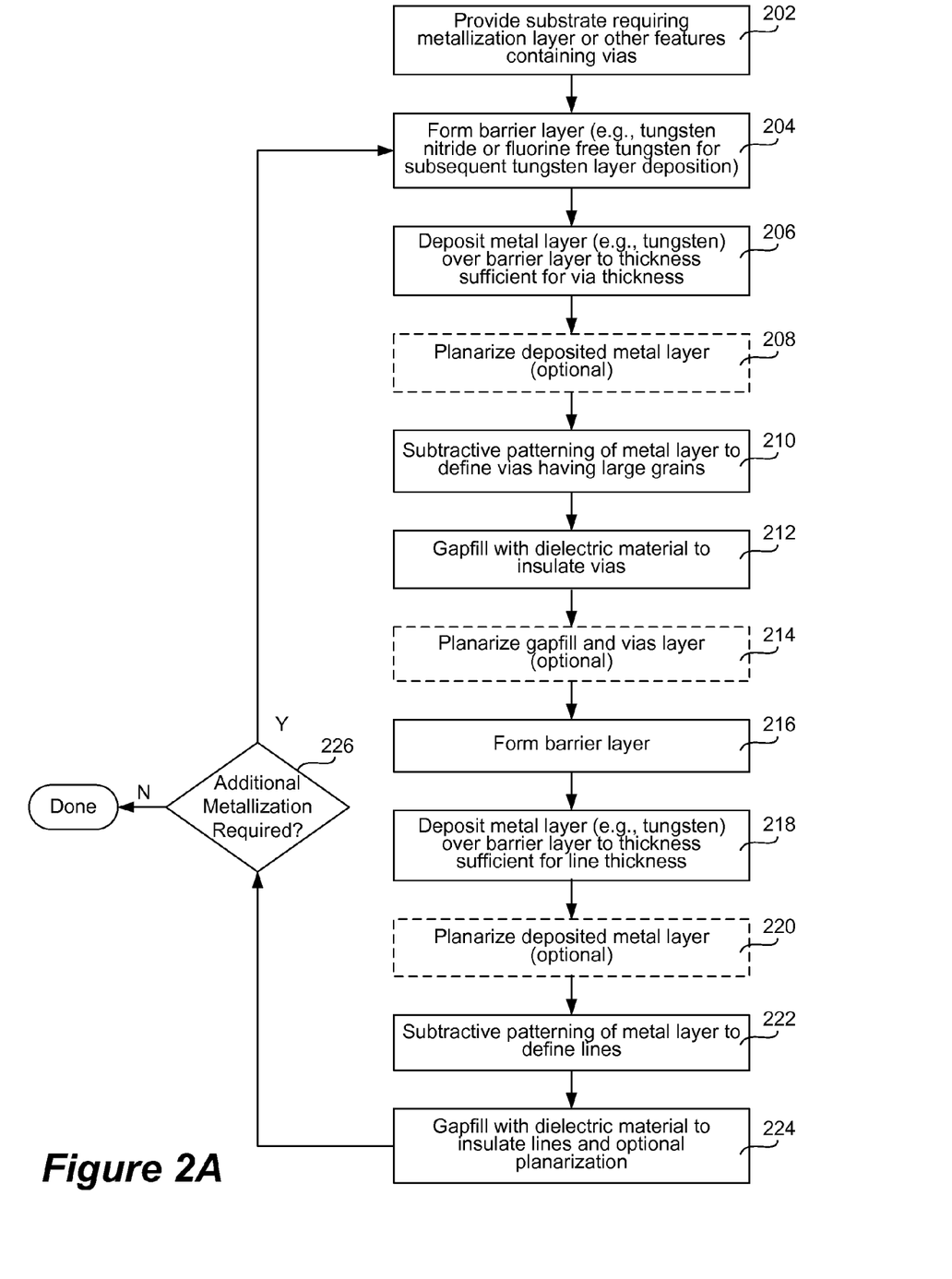
FIG. 2A is a process flow chart depicting one method for producing a metallization layer using subtractive patterning.
Figures 2B, 2C, 2D, 2E, 2F:
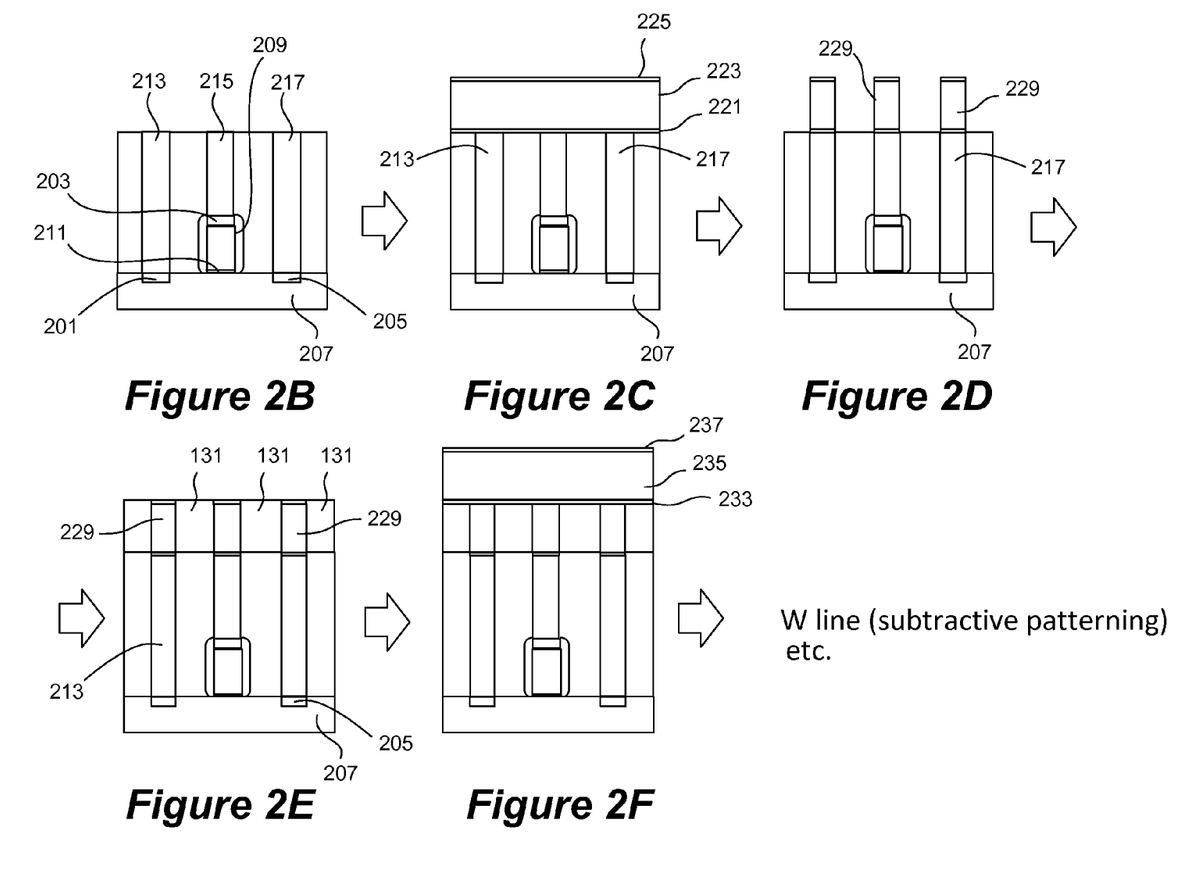
FIGS. 2B-F are schematic depictions of a device cross-section at sequential stages in a subtractive patterning process for forming vias.

An example process flow is depicted in the flow chart of FIG. 2A and cross-sectional diagrams 2B through 2F. As shown in FIGS. 2A and 2B, the process begins with a fully formed device produced in accordance with front end of line (FEOL) processing technology. See block 202 of the FIG. 2A flow chart. In the device cross-section depicted in FIG. 2B, a transistor structure is shown having source, drain, and gate contacts 201, 203, and 205. These may be made from a silicide or other highly conductive material. The source, drain, and gate are formed on a semiconductor substrate 207 such as a single crystal silicon substrate. A gate electrode 209 is formed on top of a thin layer of gate oxide 211. Tungsten contacts 213, 215, and 217 extend vertically from the ohmic contacts 201, 203, and 205 through vias to provide a connection between the device electrodes and the interconnects that will be formed in the overlying first metallization layers.

It should be understood that while a simple three electrode CMOS device is depicted in FIG. 2B, other embodiments employ other types of devices including memory devices and various logic devices. It should also be understood that the tungsten contacts 213, 215, and 217 may be formed by any of a number of processes including a conventional via fill process. It should also be understood that these contacts need not be made from tungsten.

Considering now FIG. 2C, the structure shown in FIG. 2B is further processed to provide a blanket layer of tungsten which will ultimately be converted to multiple tungsten vias. Initially, a barrier layer 221 such as a layer formed from tungsten nitride and/or a fluorine-free tungsten material or a titanium nitride is formed over the top of a structure produced in FIG. 2B. See also 204 of the FIG. 2A flow chart. Tungsten barriers are employed to protect the underlying or adjacent dielectric or other material from attack by the aggressive compounds used to deposit tungsten metal. Of particular concern is the highly reactive tungsten hexafluoride precursor conventionally used to deposit tungsten metal. The fluorine associated with tungsten hexafluoride can etch or otherwise damage the dielectric and/or result in adhesion problems for these subsequently deposited blanket tungsten layer.

After tungsten barrier layer 221 is deposited, the process continues with deposition of a bulk tungsten layer 223 which will form the of tungsten metal grains used in the subsequently formed vias. See operation 206 in the FIG. 2A flowchart. As indicated above, the tungsten layer may be blanket deposited by a conventional chemical vapor deposition process or some other suitable process such as atomic layer deposition (ALD), pulsed nucleation layer deposition (PNL), or even a physical vapor deposition process (PVD). The PVD process can be a conventional PVD process or an ionized PVD process or some other variation of PVD. Additionally, the tungsten material deposited to produce layer 223 may be a conventional tungsten material or may be a low-resistivity tungsten such as the tungsten described in U.S. Pat. No. 7,589,017, issued Sep. 15, 2009, which is incorporated herein by reference in its entirety.

The bulk tungsten layer 223 may be optionally planarized by chemical mechanical polishing (CMP) or other planarization process. See block of 208 of the FIG. 2A flowchart. Planarization may be necessary if the lithography process that follows cannot be performed with sufficient resolution to produce suitable via structures. Further, planarization or other material removal process may be employed to reduce the thickness of the tungsten blanket layer. In certain embodiments, the tungsten layer is grown to a relatively great thickness in order to increase the grain size. It has been found that under some conditions, the tungsten grain size increases with increasing thickness of the deposited tungsten layer. When excess tungsten is deposited for this purpose, the top region of the layer (sometimes called "overburden") is typically removed prior to further processing. In such embodiments, the excess tungsten may be removed at either block 208 or 214 in the flow chart. Additionally, a post-deposition treatment may be applied to the deposited layer in order to increase and/or stabilize the grain size of the metal. Such treatments include, e.g., exposure to plasma, annealing, exposure to ultraviolet radiation, etc.

After the layer 223 is optionally planarized, it is coated with an anti-reflective coating as depicted by layer 225 in FIG. 2C. Any suitable anti-reflective coating may be used for this purpose as is well known in the art.

The process continues as depicted in FIG. 2D. As shown there, a conventional (or non-conventional) lithography process is employed to define the locations of tungsten vias 229 in the first metallization layer. A conventional lithography process involves depositing a photoresist, focusing light on the photoresist, exposing the photoresist, and removing the exposed or non-exposed regions of the photoresist, depending upon whether the photoresist is a positive or negative photoresist. All the possible variations of lithography are contemplated for this application and the one that is actually chosen will be suitable for the particular technology node in which the process is implemented. For example, an electron beam lithography may be employed in which an electron beam is used in place of focused light to define the pattern. It should be noted that for some technology nodes, such as nodes below 22 nanometers, it may be appropriate to use an immersion-based photolithography process. After the lithography process is completed, tungsten layer 223 is patterned by, for example, performing a tungsten dry etch. This may be accomplished with, for example, chemistries that have been conventionally employed to produce bit lines in DRAM devices. Examples of tungsten etching processes are presented in the following U.S. Patent applications, each incorporated by reference herein in its entirety: U.S. patent application Ser. No. 12/535,464, filed Aug. 4, 2009; U.S. patent application Ser. No. 12/833,823, filed Jul. 9, 2010; U.S. patent application Ser. No. 12/332,017, filed Dec. 10, 2008; and U.S. patent application Ser. No. 12/535,377, filed Aug. 4, 2009. In certain embodiments, the etching may be performed in two stages: a first anisotropic etch which produces slightly oversized vias, followed by an isotropic etch to trim the oversized vias to the appropriate final size. Both of these etches are typically performed using gas phase etchants. After etching, the tungsten vias 229 and/or other device structures are treated by stripping the residual photoresist and cleaning. This sequence of lithography, etching, and stripping/cleaning produces the structure shown in FIG. 2D. The subtractive patterning operation described with reference to this figure is captured by block 210 in the FIG. 2A flowchart.

Moving on to FIG. 2E, the first metallization layer is depicted after a dielectric or other insulating material 231 is added to fill the gaps between the individual tungsten vias 229. See also block 212 of the FIG. 2A flowchart. The dielectric material may be deposited by any of a number of suitable processes including spin-on processes, PECVD, etc. In some embodiments, the dielectric material is provided by a "flow" deposition process such as described in U.S. patent application Ser. No. 11/834,581, filed Aug. 6, 2007; U.S. patent application Ser. No. 12/964,110, filed Dec. 9, 2010; and U.S. Pat. No. 7,629,227, issued Dec. 8, 2009, each incorporated herein by reference in its entirety. The gaps can be filled with conventional or low k dielectrics since the aspect ratio of the gap between the vias is fairly low (typically less than 1). The particular dielectric material is typically an oxide, although other materials such as polymers, carbides, nitrides, oxygenated variations of any of these, and the like, can be employed as well. In many embodiments, the dielectric is a low k dielectric.

After the dielectric material fills the gaps between vias 229, the surface of the structure is optionally planarized by a planarization process such as CMP. See block 214 in FIG. 2A. Whether or not a planarization is employed will depend in part upon the particular technology employed to deposit the dielectric 231 around the patterned vias 229.

At this point in the process, the further processing can take two different paths. In one path, the interconnection lines between the vias are prepared by a conventional copper damascene methodology. In a different approach—the one depicted in FIG. 2A—the interconnecting lines are formed by subtractive patterning another layer of tungsten. In the tungsten subtractive process, the interconnect lines are formed by first depositing a blanket layer of tungsten on a layer containing vias, such as those formed as described above, and then performing subtractive patterning to define the interconnect lines. As with the above via formation process, the morphology of the metal in the resulting structures is substantially the same as that produced in the as deposited metal layer. This approach has the advantage of producing lines having high conductivity in comparison to such features produced by conventional template or damascene-type fill processes.

FIG. 2F shows the next step in this second option. As depicted in FIG. 2F, a blanket layer of tungsten material is deposited on top of a planarized structure produced at the end of operations described in association with FIG. 2E. Initially, in this version of a process of forming the interconnects of a first metallization layer, a tungsten barrier 233 is formed on top of the dielectric and exposed vias surface. See block 216 of the FIG. 2A flowchart. The tungsten barrier may be, as described above, a tungsten nitride, a fluorine-free tungsten material, a titanium nitride material, or other suitable barrier.

After depositing the tungsten barrier layer 233, the bulk layer of tungsten 235 is deposited as shown. See block 218 of the FIG. 2A flowchart. As with layer 223, blanket tungsten layer 235 may be deposited by any of a number of different techniques including CVD, ALD, and PVD techniques. It may have any of a number of different tungsten compositions such as a low resistance tungsten composition as mentioned above. Further, excess tungsten may be deposited or additional processing may be performed to increase or stabilize the grain size.

After tungsten layer 235 is deposited, its surface is optionally planarized by CMP or other suitable process described above in the context of layer 223. See operation 220 of FIG. 2A. Then, an anti-reflective coating 237 is deposited on top of tungsten layer 135. From there, subtractive patterning may be employed to define the tungsten lines interconnecting the tungsten vias 229. See operation 222 of FIG. 2A. As described in the context of FIG. 2D, this patterning may involve lithography, etching, stripping, cleaning, etc. A two-step etching process (anisotropic followed by isotropic) may be performed as described above. Further, the etch chemistry and some other features of the patterning may be adapted from conventional DRAM bit line patterning. Thereafter, as indicated by operation 224 of FIG. 2A, gap fill is performed to provide dielectric around the newly formed tungsten interconnect lines.

The process depicted in FIGS. 2A through 2F presents the steps that might be employed to provide an all tungsten first metallization layer. A similar sequence of processing steps may be employed to provide subsequent metal layers comprising all tungsten or at least tungsten vias. The optional additional iterations of the above process sequence to produce other metallization layers are illustrated in the context of a decision block 226 in FIG. 2A.

Figures 3A, 3B:
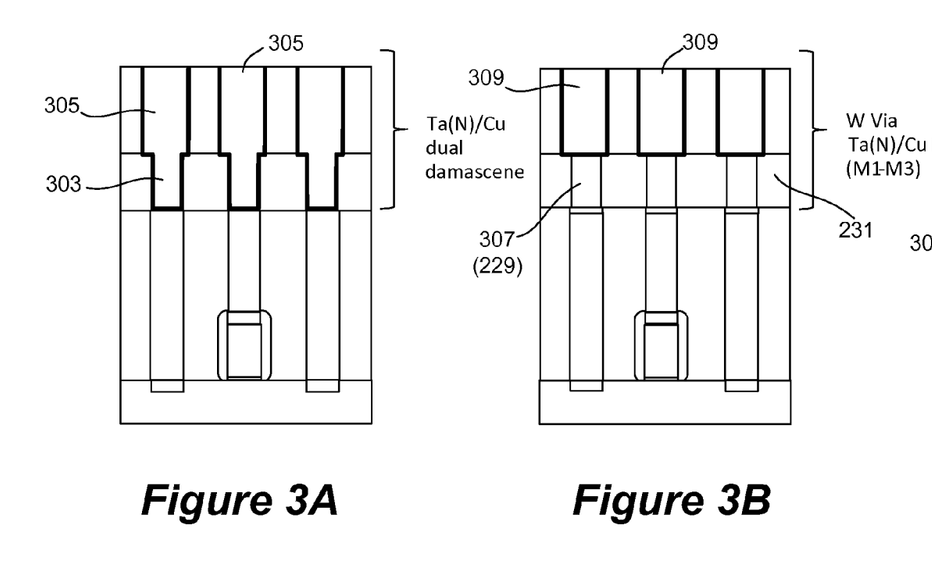
FIGS. 3A-C are schematic depictions comparing conventional copper damascene and tungsten subtractive patterning processes.
Figure 3C:
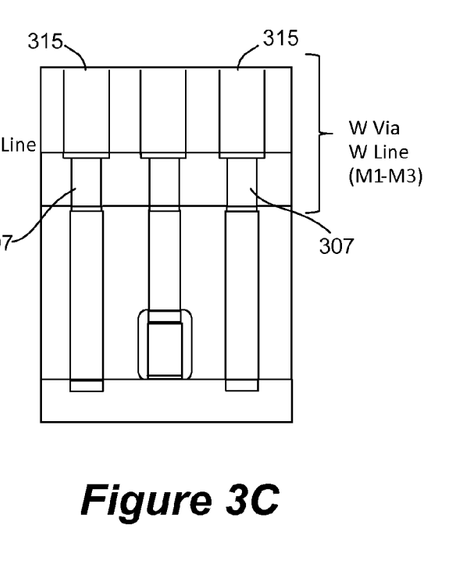

FIGS. 3A, 3B, and 3C show, respectively, (i) the current copper damascene metallization layer, (ii) a hybrid tungsten via and copper damascene interconnect line metallization layer, and (iii) an entirely tungsten metallization layer. In FIG. 3A, both vias 303 and interconnect lines 305 are made from copper with a copper diffusion barrier such as tantalum metal or tantalum nitride. A conventional damascene process is employed to form these structures.

In the embodiment of FIG. 3B, the vias 307 are made from a blanket deposition of tungsten followed by subtractive patterning as described with respect to FIGS. 2B through 2E. (Vias 307 correspond to vias 229 in FIG. 2E.) After the tungsten vias are formed, the interconnect metal lines are formed from a copper damascene process by plating copper into trenches lined with a copper diffusion barrier such as tantalum or tantalum nitride. See lines 309 in FIG. 3B. Note that this structure is incompatible with the structure shown in FIG. 2F, where the interconnect lines are made from tungsten.

FIG. 3C depicts the all tungsten approach to forming a metallization layer. This structure would be the natural successive outgrowth of the process shown through FIG. 2F. It is also the result of one pass through the process flow depicted in FIG. 2A. Specifically, the individual metal interconnect lines 315, as well as the vias 307, are made from tungsten patterned by subtractive patterning from blanket tungsten layer 235 in FIG. 2F.

As mentioned, FIG. 1B depicts a via or trench cross-section in which tungsten metal has been deposited by a conventional conformal deposition process. As can be seen, the via 101 is filled with tungsten 103 having a center line seam 105 spanning much of the via depth. The tungsten fill 103 is comprised of numerous individual tungsten grains 107. These individual grains grow outward from the edges of via 101 including the sidewalls and bottom of the via. As a consequence of the tungsten metal grains growing outward from the sidewalls, their growth is limited to a size that is approximately one-half the width of via 101. This is because any further growth would become impossible because it would be blocked by grains growing outward from the opposite parallel sidewall. The point at which the grains growing from opposite sidewalls contact one another is seam 105.

As explained, the conductivity of tungsten metal is determined in some measure by the grain size of the tungsten deposited. Deposited tungsten having larger grain sizes has a higher conductivity. This is because electrons traveling through the tungsten scatter every time they encounter a grain boundary. Of course, electrons scattering during transport reduces the conductivity of the material.

Figure 4:
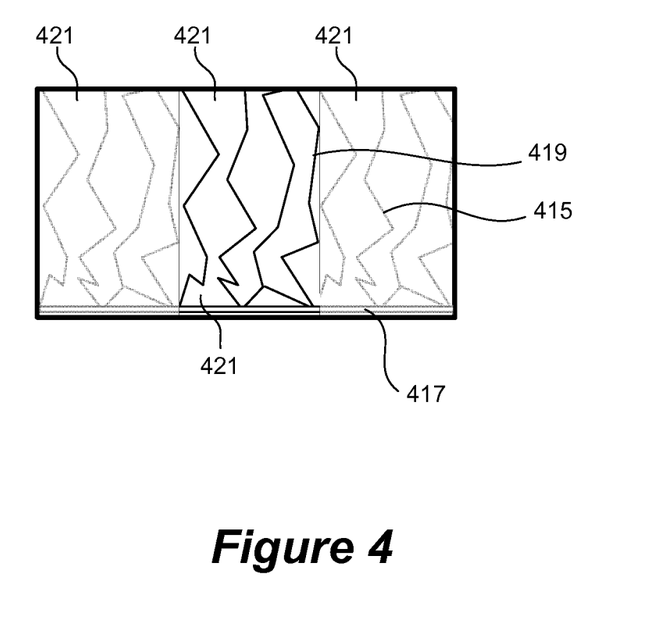
FIG. 4 is a cross-sectional cartoon depiction of a via produced by subtractive patterning.

FIG. 4 depicts schematically how to address this difficulty and effectively increase the conductivity of the deposited tungsten metal. As shown in FIG. 4, tungsten is deposited not in a pre-defined via or other feature on a substrate surface but rather as a blanket coating the entire surface of the substrate. Therefore the tungsten grains can grow to a size effectively equivalent to the via height. Only after the grains have formed in the blanket tungsten layer is the layer patterned to define the vias. This is shown in FIG. 4 as an original tungsten sheet 415 on a substrate having a barrier layer 417 and a via 419 defined in the original tungsten sheet. The as-deposited tungsten layer has a series of large grains 421 which, as noted, have a size approximately equal to the via height. As shown in FIG. 1A, tungsten deposited into features by a conventional CVD fill process has a much higher resistivity than tungsten deposited as a blanket layer and then subtractively patterned to define tungsten vias.

Metal Deposition Processes

Tungsten and other metals may be blanket deposited by various techniques including PVD, CVD, and ALD technologies. One suitable PNL/CVD process will now be described. A PVD process will follow.

Some examples of PNL/CVD processes may be found in the following patent application: U.S. application Ser. No. 12/755,259, filed Apr. 6, 2010, which is incorporated herein by reference for all purposes. In certain embodiments, the wafer is initially heated to the process temperature in a vacuum chamber, and then a very thin portion of tungsten film, which serves as a seed or nucleation layer, is deposited. Thereafter, the remainder of the tungsten film (the bulk layer) is deposited on the nucleation layer. Conventionally, the tungsten bulk layer is formed by the reduction of tungsten hexafluoride ($WF_6$) with hydrogen ($H_2$) on the growing tungsten layer.

Before the nucleation layer is deposited, the process may include forming a liner/barrier layer on the substrate surface. Examples of liner layers include Ti/TiN, TiN and WN. In addition to or instead of diffusion barrier layers, the feature may include layers such as an adhesion layer, a partial nucleation layer, a combination of thereof, or any other applicable material lining the substrate surface.

A tungsten nucleation layer is then deposited over the substrate. In general, a nucleation layer is a thin layer which serves to facilitate the subsequent formation of a bulk material thereon. Various processes may be used to form the nucleation layer, including but not limited to, CVD processes, atomic layer deposition (ALD) processes and pulsed nucleation layer (PNL) deposition processes.

In a PNL technique, pulses of reactants are sequentially injected and purged from the reaction chamber, typically by a pulse of a purge gas between reactants. A first reactant is typically adsorbed onto the substrate, available to react with the next reactant. The process is repeated in a cyclical fashion until the desired thickness is achieved. PNL is similar to atomic layer deposition techniques reported in the literature. PNL is generally distinguished from ALD by its higher operating pressure range (greater than 1 Torr) and its higher growth rate per cycle (greater than 1 monolayer film growth per cycle). In the context of the description provided herein, PNL broadly embodies any cyclical process of sequentially adding reactants for reaction on a semiconductor substrate. Thus, the concept embodies techniques conventionally referred to as ALD. In the context of description provided herein, CVD embodies processes in which reactants are together introduced to a reactor for a vapor-phase reaction. PNL and ALD processes are distinct from CVD processes and vice-versa.

Forming a nucleation layer using one or more PNL cycles is discussed in U.S. Pat. Nos. 6,844,258, issued Jan. 18, 2005; U.S. Pat. No. 7,005,372, issued Feb. 28, 2006; U.S. Pat. No. 7,141,494, issued Nov. 28, 2006; U.S. Pat. No. 7,262,125, issued Aug. 28, 2007; U.S. Pat. No. 7,589,017, issued Sep. 15, 2009; U.S. Pat. No. 7,772,114, issued Aug. 10, 2010; and U.S. patent application Ser. No. 12/030,645, filed Feb. 13, 2008, and Ser. No. 12/407,541, filed Mar. 19, 2009, each of which is incorporated herein by reference in its entirety. These PNL nucleation layer processes involve exposing a substrate to various sequences of reducing agents and tungsten precursors to grow a nucleation layer of the desired thickness. A combined PNL-CVD method of depositing a nucleation layer is described in U.S. Pat. No. 7,655,567, issued Feb. 2, 2010, also incorporated in its entirety.

In certain embodiments, depositing the nucleation layer is followed by a post-deposition treatment operation to improve conductivity. Such treatment operations are described in more detail in U.S. Pat. No. 7,772,114, issued Aug. 10, 2010, and U.S. patent application Ser. No. 12/407,541, filed Mar. 19, 2009, both of which are incorporated by reference herein in their entireties.

Once the nucleation layer is formed, the process continues by depositing a CVD tungsten film (306). In this operation, a reducing agent and a tungsten-containing precursor are flowed into a deposition chamber to deposit a bulk layer on the substrate. An inert carrier gas may be used to deliver one or more of the reactant streams, which may or may not be pre-mixed. Unlike PNL or ALD processes, this operation generally involves flowing the reactants continuously until the desired amount is deposited. In certain embodiments, the CVD operation may take place in multiple stages, with multiple periods of continuous and simultaneous flow of reactants separated by periods of one or more reactant flows diverted.

Various tungsten-containing gases including, but not limited to, $WF_6$, $WCl_6$, and $W(CO)_6$ can be used as the tungsten-containing precursor. In certain embodiments, the tungsten-containing precursor is a halogen-containing compound, such as $WF_6$. In certain embodiments, the reducing agent is hydrogen gas, though other reducing agents may be used including silane ($SiH_4$), disilane ($Si_2H_6$) hydrazine ($N_2H_4$), diborane ($B_2H_6$) and germane ($GeH_4$). In many embodiments, hydrogen gas is used as the reducing agent in the CVD process.

In certain embodiments, a fluorine-free CVD tungsten deposition process may be employed, as described in U.S. patent application Ser. No. 11/963,698, filed Dec. 21, 2007, entitled "Methods for Forming All Tungsten Contacts and Lines," by Raashina Humayun et al., which is incorporated by reference herein for all purposes.

In various alternative embodiments, tungsten is deposited by a PVD process. Many suitable PVD processes are available. A number of ionized PVD systems including a planar magnetron and a hollow cathode magnetron (HCM) systems may be used to deposit tungsten or other metal layers in accordance with described embodiments. In one illustrative example, such a system includes an HCM PVD module. In this module, tungsten is sputtered onto the substrate from a hollow cup-shaped tungsten target, which is disposed above the substrate, and is negatively biased with a DC power supply. An inert gas, such as argon is flowed into the process chamber and is ionized in a plasma to form positively charged ions, which impinge on the target with sufficient energy to dislodge tungsten atoms. The plasma is typically magnetically confined within the hollow target region and may be also magnetically confined in the proximity of the wafer substrate using a number of magnets disposed outside of the process chamber. Typically, neutral and ionized metal, as well as neutral and ionized gas will be present in the process chamber during deposition. As mentioned, the tungsten target may include other elements (besides tungsten) when the goal is to deposit a tungsten alloy or a tungsten compound. Of course, copper and copper alloys (or other via and/or line material) can be deposited by PVD as well.

Some examples of suitable PVD apparatus are provided in U.S. patent application Ser. No. 12/154,984, filed May 28, 2008, which is incorporated herein by reference in its entirety and for all purposes.

In certain embodiments, the metal layer is blanket deposited to a thickness approximately as thick as the height of the lines or vias to be produced by subtractive patterning. In certain embodiments, the thickness will be at least as great as the height of the lines or vias. In this regard, the thickness will account for material removal by planarization or other technique prior to patterning.

Various techniques may be employed to increase grain size. One of these involves depositing the metal layer to a relatively great thickness; e.g., at least about 20 nm, or at least about 30 nm, or at least about 50 nm, or at least about 75 nm. With this in mind, the metal layer may be deposited with significant excess thickness or overburden, which is removed prior to patterning or after gapfill dielectric deposition. In some embodiments, as described elsewhere herein, the average grain size in the vias or lines produced by subtractive patterning is at least about 5 nm or at least about 10 nm.

Tungsten atoms, for example, are known to be relatively mobile even at modest temperatures, including room temperature. For example, tungsten grains are capable of undergoing transitions between alpha and beta metastable phases at room temperature. Tungsten mobility may be partially responsible for grain growth as the blanket layer increases in thickness. Other techniques, including various post-deposition treatments, may be employed to increase and/or stabilize grain size through continued growth, coalescence, etc.

Examples of such techniques include exposure to plasma, high or low temperatures, and/or ultraviolet radiation.

Steps may also be taken to reduce the roughness of the deposited tungsten. For example, the nucleation conditions have been found to have a strong role in the roughness of the overall tungsten layer. For example, the nucleation temperature may be controlled to reduce the roughness. Additionally, nitrogen may be provided in the process gas during CVD to reduce the roughness of tungsten blanket layers. Generally, PVD produces less rough tungsten lines and via.

Via and Line Constituent Materials

As indicated above, various embodiments described herein pertain to forming vias and/or interconnect lines from tungsten, and particularly from tungsten having relatively large grain size in comparison to the size of the vias or lines. This includes grains at least as large as one half the via or line width, accounting for any barrier or liner in the via or line. Tungsten and various alloys thereof may be employed in the disclosed embodiments. Examples of such alloys include TiW, W(Al), W(Cu) and W(Re). Additionally, the disclosed subtractive patterning processes may be employed to produce vias and/or interconnect lines for other metals such as copper, aluminum, titanium, tantulum, ruthenium, cobalt, etc as well as corresponding compounds (e.g. TiW and TaN) and alloys (e.g. Cu(Al), Cu(Mg), Cu(Ti), and Cu(Mn)).

Low-resistivity tungsten (LRW) and processes for depositing such are described in various patent applications including the following, each of which is incorporated herein by reference in its entirety: U.S. Pat. No. 7,589,017, issued Sep. 15, 2009; U.S. patent application Ser. No. 11/963,698, filed Dec. 21, 2007, and U.S. patent application Ser. No. 12/755,259, filed Apr. 6, 2010. In some embodiments, the LRW process includes first forming a low temperature PNL nucleation layer followed by a multi-pulse (reducing agent or reducing agent+tungsten precursor) low resistivity treatment, and example of which follows:

B2H6/WF6 (several cycles at 300) nucleation
B2H6/WF6 multi-pulse (300 or 400 C, pulse time short enough so no W deposited) H2/WF6 CVD In some embodiments, a low-resistivity tungsten layer includes a tungsten rich layer having tungsten mixed with a low resistivity tungsten compound, e.g., tungsten carbide or tungsten nitride, as a base for deposition of tungsten nucleation and/or bulk layers. According to various embodiments, these tungsten rich layers may be used as barrier and/or adhesion layers. Deposition of the tungsten-rich layers may involve exposing the substrate to a halogen-free organometallic tungsten precursor and a reducing agent to thereby deposit a tungsten-rich barrier film, wherein the tungsten-rich barrier film comprises a mixture of metallic tungsten and a tungsten carbide and then exposing the substrate to a tungsten-containing precursor to deposit one or more tungsten layers on the tungsten-rich barrier film. The tungsten-rich barrier layer is typically deposited as a thin layer on the substrate surface. In certain embodiments, depositing the tungsten layer(s) on the tungsten-rich barrier film involves using a halogen-containing tungsten precursor, e.g., $WF_6$. The mixed tungsten/tungsten carbide layer is a thin, low resistivity film with excellent adhesion and a good base for subsequent tungsten plug or line formation.

As indicated, in some embodiments, the size of the metal grains (crystallites) in IC vias is on the same order as the height of the vias. The same is true of metal grains in interconnect lines. Typically, the metal grains have an average size that is at least as great as the via or line width. In some embodiments, the grain size is substantially greater than one-half the via or line width. In some cases, the metal grains are grown to a size that exceeds the via diameter, in which cases, a single grain may occupy the entire via.

In various embodiments, the grain size in vias and lines is, on average, at least about 5 nm, measured across the longest dimension of the grains. In some cases, the average grain size is between about 10 and 50 nm. In a more specific embodiment, the grain size is between about 10 and 25 nm. The grain size may be determined by any suitably accurate method such as by electron microscopy or x-ray diffraction using, e.g., the Rietveld method. It should be borne in mind that a typical blanket layer contains a distribution of grain sizes, so the sizes mentioned herein are averages or means of the distribution found in a layer, via, or line.

In various embodiments, the via or line produced by subtractive patterning has a width of not greater than about 25 nanometers, or not greater than about 15 nanometers. For many applications, the via or line has a width of between about 10 and 20 nm. It should be understood that devices having lines or vias made by subtractive patterning may have a range or distribution of via/line widths and/or aspect ratios. Of course, devices such as memory devices may have many or all vias of the same size and/or aspect ratio. When tungsten is employed in vias for technology nodes beyond the 22 nanometer node, it preferably has a resistivity of at most about 30 μΩ cm (in some cases at most about 15 μΩ cm).

Apparatus

The methods herein may be carried out in various types of deposition apparatus available from various vendors. Examples of suitable apparatus include a Novellus Concept-1 Altus™, a Concept 2 Altus™, a Concept-2 ALTUS-S™, Concept 3 Altus™ deposition system, and Altus Max™ or any of a variety of other commercially available CVD and/or PVD tools such as the Endura™ PVD tool, the Centura™ CVD tool or the Sprint Tungsten™ tool from Applied Materials In some cases, a PNL/CVD process can be performed on multiple deposition stations sequentially. See, e.g., U.S. Pat. No. 6,143,082, which is incorporated herein by reference for all purposes. In some embodiments, a nucleation layer is deposited, e.g., by a pulsed nucleation process at a first station that is one of two, five or even more deposition stations positioned within a single deposition chamber. Thus, the reducing gases and the tungsten-containing gases are alternately introduced to the surface of the semiconductor substrate, at the first station, using an individual gas supply system that creates a localized atmosphere at the substrate surface.

A second station may then be used to complete nucleation layer deposition or to perform a multi-pulse low resistivity treatment. In certain embodiments, a single pulse low resistivity treatment may be performed.

One or more stations are then used to perform CVD as described above. Two or more stations may be used to perform CVD in a parallel processing. Alternatively a wafer may be indexed to have the CVD operations performed over two or more stations sequentially.

Figure 5:
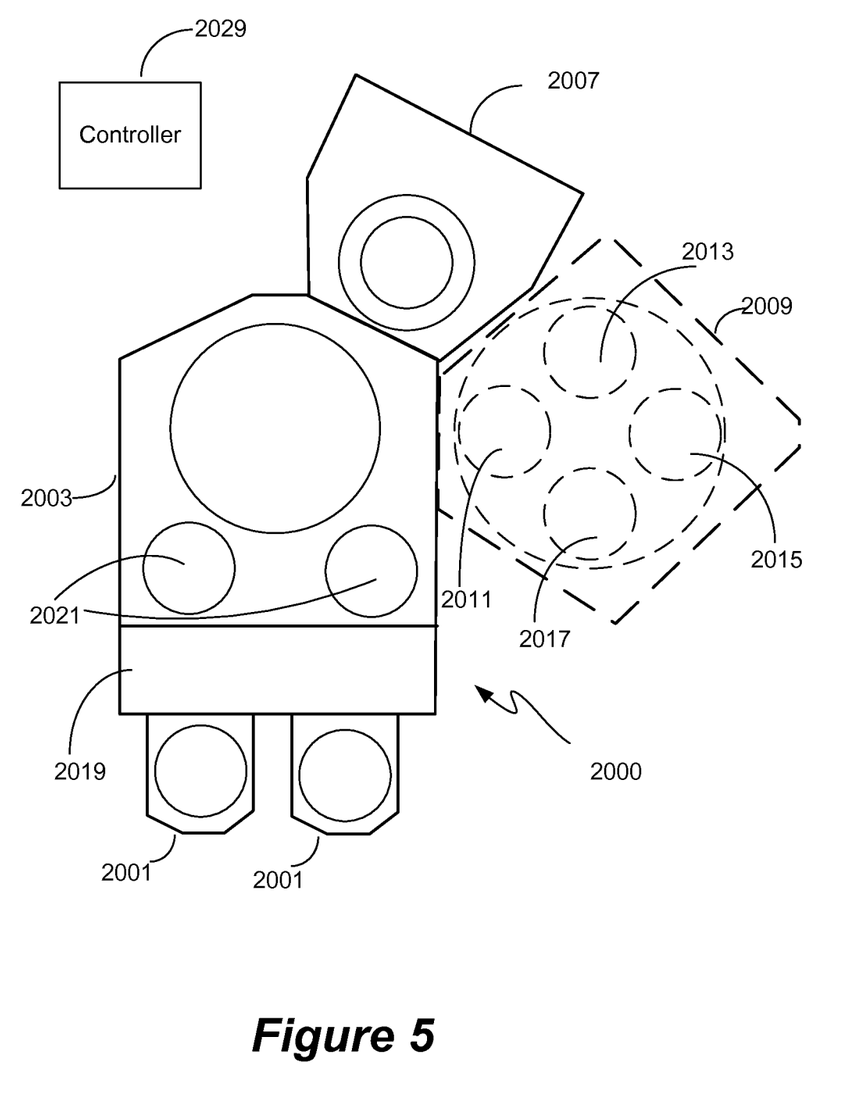
FIGS. 5 and 6 are schematic illustrations of tools suitable for performing certain operations of the subtractive patterning process described herein.
Figure 6:
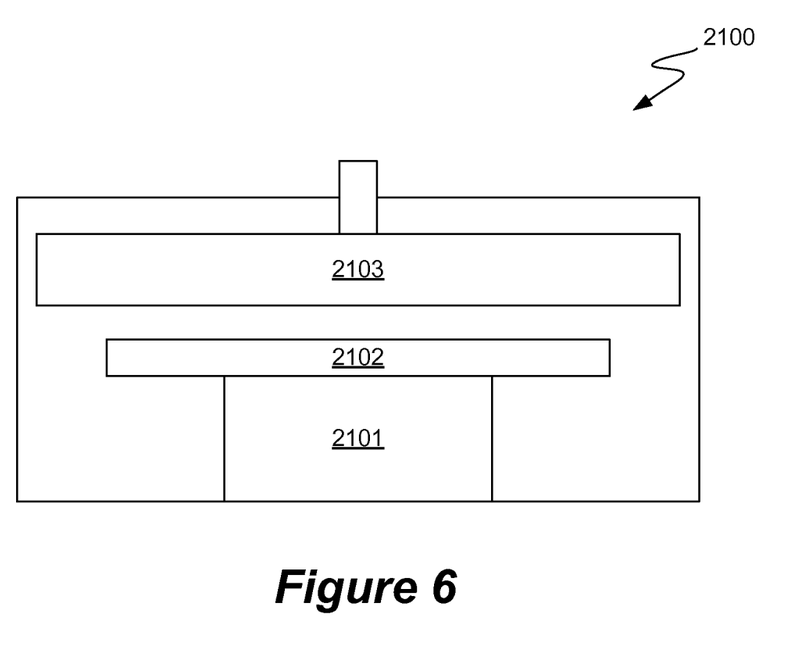

FIG. 5 is a block diagram of a processing system suitable for conducting PNL-CVD tungsten thin film deposition processes. The system 2000 includes a transfer module 2003. The transfer module 2003 provides a clean, pressurized environment to minimize the risk of contamination of substrates being processed as they are moved between the various reactor modules. Mounted on the transfer module 2003 is a multi-station reactor 2009 capable of performing PNL deposition, multi-pulse treatment if desired, and CVD. Chamber 2009 may include multiple stations 2011, 2013, 2015, and 2017 that may sequentially perform these operations. For example, chamber 2009 could be configured such that station 2011 performs PNL deposition, station 2013 performs multi-pulse treatment, and stations 2015 and 2017 perform CVD. Each deposition station includes a heated wafer pedestal and a showerhead, dispersion plate or other gas inlet. An example of a deposition station 2100 is depicted in FIG. 6, including wafer support 2102 and showerhead 2103. A heater may be provided in pedestal portion 2101.

Also mounted on the transfer module 2003 may be one or more single or multi-station modules 2007 capable of performing plasma or chemical (non-plasma) pre-cleans. The module may also be used for various other treatments, e.g., post liner tungsten nitride treatments. The system 2000 also includes one or more (in this case two) wafer source modules 2001 where wafers are stored before and after processing. An atmospheric robot (not shown) in the atmospheric transfer chamber 2019 first removes wafers from the source modules 2001 to loadlocks 2021. A wafer transfer device (generally a robot arm unit) in the transfer module 2003 moves the wafers from loadlocks 2021 to and among the modules mounted on the transfer module 2003.

In certain embodiments, a system controller 2029 is employed to control process conditions during deposition. The controller will typically include one or more memory devices and one or more processors. The processor may include a CPU or computer, analog and/or digital input/output connections, stepper motor controller boards, etc.

The controller may control all of the activities of the deposition apparatus. The system controller executes system control software including sets of instructions for controlling the timing, mixture of gases, chamber pressure, chamber temperature, wafer temperature, RF power levels, wafer chuck or pedestal position, and other parameters of a particular process. Other computer programs stored on memory devices associated with the controller may be employed in some embodiments.

Typically there will be a user interface associated with the controller. The user interface may include a display screen, graphical software displays of the apparatus and/or process conditions, and user input devices such as pointing devices, keyboards, touch screens, microphones, etc.

The computer program code for controlling the deposition and other processes in a process sequence can be written in any conventional computer readable programming language: for example, assembly language, C, C++, Pascal, Fortran or others. Compiled object code or script is executed by the processor to perform the tasks identified in the program.

The controller parameters relate to process conditions such as, for example, process gas composition and flow rates, temperature, pressure, plasma conditions such as RF power levels and the low frequency RF frequency, cooling gas pressure, and chamber wall temperature. These parameters are provided to the user in the form of a recipe, and may be entered utilizing the user interface.

Signals for monitoring the process may be provided by analog and/or digital input connections of the system controller. The signals for controlling the process are output on the analog and digital output connections of the deposition apparatus.

The system software may be designed or configured in many different ways. For example, various chamber component subroutines or control objects may be written to control operation of the chamber components necessary to carry out suitable deposition processes. Examples of programs or sections of programs for this purpose include substrate positioning code, process gas control code, pressure control code, heater control code, and plasma control code.

A substrate positioning program may include program code for controlling chamber components that are used to load the substrate onto a pedestal or chuck and to control the spacing between the substrate and other parts of the chamber such as a gas inlet and/or target. A process gas control program may include code for controlling gas composition and flow rates and optionally for flowing gas into the chamber prior to deposition in order to stabilize the pressure in the chamber. A pressure control program may include code for controlling the pressure in the chamber by regulating, e.g., a throttle valve in the exhaust system of the chamber. A heater control program may include code for controlling the current to a heating unit that is used to heat the substrate. Alternatively, the heater control program may control delivery of a heat transfer gas such as helium to the wafer chuck.

Examples of chamber sensors that may be monitored during deposition include mass flow controllers, pressure sensors such as manometers, and thermocouples located in pedestal or chuck. Appropriately programmed feedback and control algorithms may be used with data from these sensors to maintain desired process conditions. The foregoing describes implementation of embodiments in a single or multi-chamber semiconductor processing tool.

Example

In general an interconnect via consists of a thin liner and/or diffusion barrier which is then filled with a primary conductor. For example, a Cu filled via may have a Ta/TaN liner/barrier while a W via may have a Ti/TiN liner/barrier or fluorine-free W liner. There is also an interfacial contact resistance associated with the interface at the bottom of the via. We have simulated the influence of a number of factors, some geometric and some materials-related, on the via resistance of both Cu and W filled vias.

The aspect ratio of the via (height-to-width) and the cross section of the via (vertical sidewalls versus tapered sidewalls) are geometric factors. Materials factors include the bulk resistivity and thicknesses of the plugfill material (Cu vs W) and the liner/barrier, as well as conduction electron scattering at the boundary between the primary conductor and the liner/barrier. We also considered the average grain size of the primary conductor since electrons reflect at adjacent grain boundaries which in turn leads to a large increase in resistivity.

Since the resistivity of the barrier/liners are generally much greater than that of the primary conductor, one would like to make them as thin as possible. This maximizes the volume in the via available for electrical conduction and reduces the series resistance at the bottom of the via as current flows across the barrier/liner.

Figure 7:
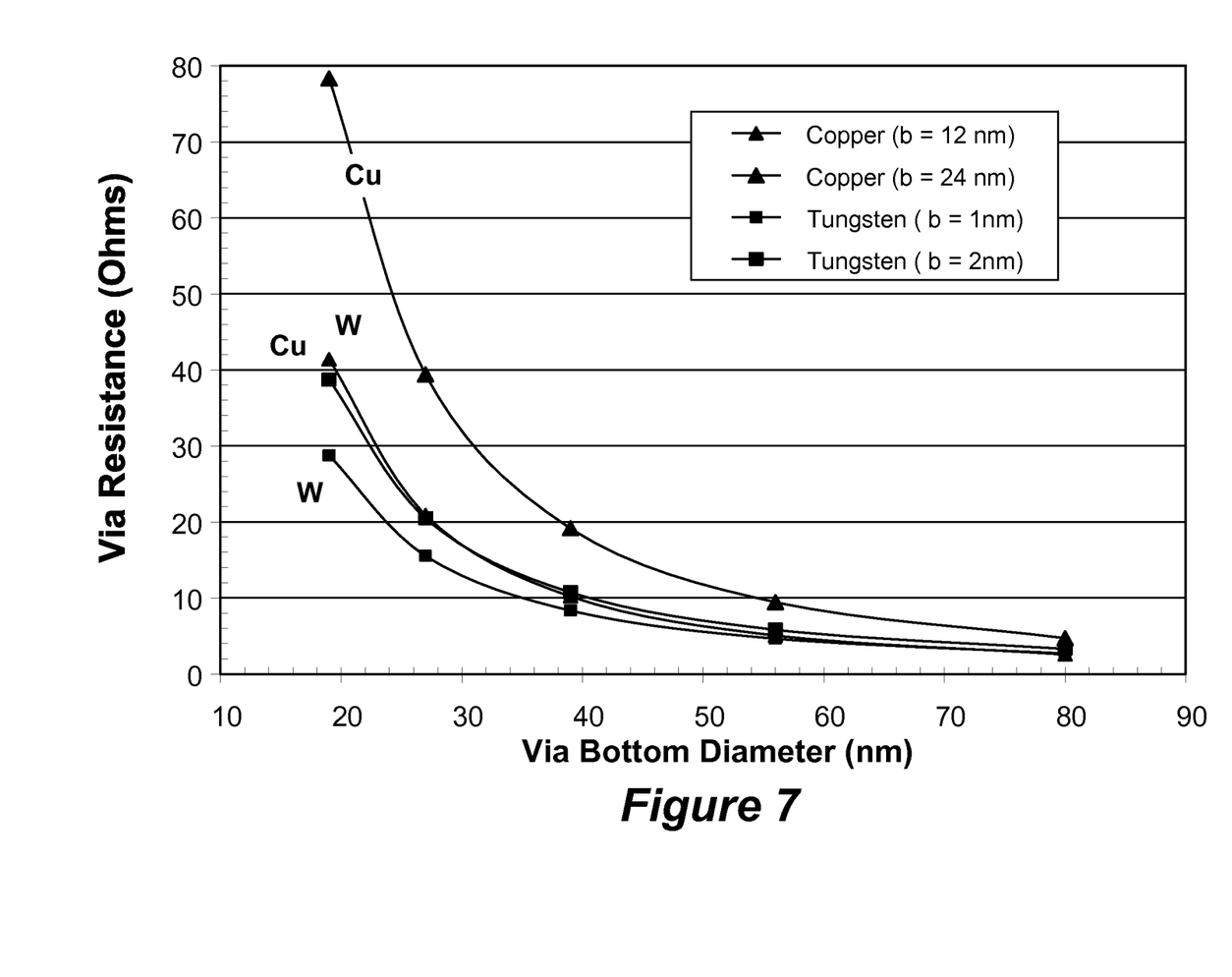
FIG. 7 is a graph showing via resistance, for tungsten filled vias, as a function of via bottom diameter.

The plot in FIG. 7 compares the calculated via resistance of a Cu and a W filled via using representative Ta/TaN liner/barrier thickness for Cu (total thickness b=12 and 24 nm), and much thinner fluorine free W (FFW) liner/barrier for W (b=1 and 2 nm). In this calculation, the aspect ratio of the via is 1.5 and we assumed that the W grain size is equal to the via width and not ½ the via width as would be the case for a conformal W deposition. The via does not have totally vertical sidewalls but is tapered at a realistic 20° which is representative of what is used in industry.

The simulation shows that combination of large grains and thin FFW clearly leads to a W via resistance that is comparable or less than that of Cu with the advantage being more pronounced at smaller via diameters. The curves for Cu (b=12 nm) and W (b=2 nm) are nearly the same, but using a slightly thinner FFW layer (b=1 nm) lowers the W via resistance significantly below Cu. The interfacial contact resistance has not been considered in this calculation, but the results show how the electrical resistance of a W via competes with Cu when geometric and materials factors are controlled.

Other Embodiments

While various embodiments have described, there are alterations, modifications, permutations, and substitute equivalents, which fall within the scope of this disclosure. It should also be noted that there are many alternative ways of implementing the methods and apparatuses of the present invention.

What is claimed is:

1. A method of preparing vias for a semiconductor device, the method comprising:
   (a) forming a blanket layer of metal over a partially fabricated semiconductor device, wherein the blanket layer has a thickness that is at least about the height of the vias to be prepared;
   (b) providing a pattern of vias on the blanket layer; and
   (c) removing regions of the blanket layer to produce the vias defined by the pattern, wherein the vias have grains of the metal, which grains have a size, on average, greater than one-half the width of the smallest via in the pattern.

2. The method of claim 1, wherein the metal is tungsten.

3. The method of claim 2, wherein the tungsten in the vias has a resistivity of at most about 30 μΩ cm.

4. The method of claim 1, wherein the metal is a tungsten alloy.

5. The method of claim 1, wherein the metal is copper or a copper alloy.

6. The method of claim 1, further comprising:
   (d) filling the region between the vias with a dielectric material;
   (e) forming a blanket layer of tungsten over the vias; and
   (f) patterning the blanket layer to form tungsten interconnect lines.

7. The method of claim 6, further comprising repeating (a)-(f) at least once.

8. The method of claim 1, wherein the grains have an average size of at least about 25 nm.

9. The method of claim 1, wherein the grains have an average size of at least about 5 nm.

10. The method claim 1, further comprising lining the vias with a barrier layer.

11. The method of claim 10, wherein the barrier layer comprises a fluorine free material.

12. The method of claim 1, wherein the forming a blanket layer of metal comprises performing a physical vapor deposition or ionized physical vapor deposition of the metal.

13. The method of claim 12, wherein the metal is a tungsten alloy or a copper alloy.

14. The method of claim 1, wherein the semiconductor device has dimensions specified by a technology node beyond the 22 nanometer technology node.

15. The method of claim 1, wherein removing the regions of the blanket layer comprises: (i) anisotropically etching the blanket layer to produce oversized vias; and (ii) trimming the oversized vias.

16. A method of preparing interconnect lines for a semiconductor device, the method comprising:
   (a) forming a blanket layer of metal over a partially fabricated semiconductor device, wherein the blanket layer has a thickness that is at least about the height of the interconnect lines to be prepared;
   (b) providing a pattern of the interconnect lines on the blanket layer; and
   (c) removing regions of the blanket layer to produce the interconnect lines defined by the pattern, wherein the interconnect lines have grains of the metal, which grains have an average size greater than one-half the width of the thinnest interconnect line in the pattern.

17. The method of claim 16, wherein removing the regions of the blanket layer comprises: (i) anisotropically etching the blanket layer to produce oversized interconnect lines; and (ii) trimming the oversized interconnect lines.

* * * * *